US008986522B2

(12) United States Patent
Wickramanayaka

(10) Patent No.: US 8,986,522 B2
(45) Date of Patent: Mar. 24, 2015

(54) ANGLED SPUTTERING PHYSICAL VAPOR DEPOSITION APPARATUS WITH WAFER HOLDER AND WAFER HOLDER FOR AN ANGLED SPUTTERING PHYSICAL VAPOR DEPOSITION APPARATUS

(75) Inventor: Sunil Wickramanayaka, Tokyo (JP)

(73) Assignee: Canon Anelva Corporation, Tokyo (JP)

( * ) Notice: Subject to any disclaimer, the term of this patent is extended or adjusted under 35 U.S.C. 154(b) by 917 days.

(21) Appl. No.: 13/169,831

(22) Filed: Jun. 27, 2011

(65) Prior Publication Data

US 2011/0253048 A1    Oct. 20, 2011

Related U.S. Application Data

(62) Division of application No. 11/307,284, filed on Jan. 30, 2006, now abandoned.

(30) Foreign Application Priority Data

Feb. 25, 2005    (JP) ................................ 2005-050064

(51) Int. Cl.
| C23C 14/34 | (2006.01) |
| H01L 21/687 | (2006.01) |
| H01J 37/34 | (2006.01) |
| C23C 14/50 | (2006.01) |
| C23C 14/04 | (2006.01) |
| C23C 14/22 | (2006.01) |
| H01L 21/67 | (2006.01) |

(52) U.S. Cl.
CPC ....... *H01L 21/68735* (2013.01); *H01J 37/3417* (2013.01); *C23C 14/505* (2013.01); *C23C 14/04* (2013.01); *C23C 14/225* (2013.01); *C23C 14/50* (2013.01); *H01L 21/67103* (2013.01); *H01L 21/67109* (2013.01)
USPC ...................................................... 204/298.11

(58) Field of Classification Search
CPC ............ H01J 37/32642; H01J 37/3417; C23C 14/225; C23C 14/04
See application file for complete search history.

(56) References Cited

U.S. PATENT DOCUMENTS 4,756,810 A * 7/1988 Lamont et al. ............. 204/192.3
5,529,657 A   6/1996 Ishii (Continued)

FOREIGN PATENT DOCUMENTS

| CN | 1540738 A | 10/2004 |
| JP | 02149670 | 6/1990 |
| JP | 2002-115051 | 4/2002 |
| JP | 2002-194540 | 7/2002 |

OTHER PUBLICATIONS

Official Letter issued Nov. 27, 2008 in corresponding Taiwan Application No. 95104424 and English translation thereof.

(Continued)

*Primary Examiner* — Jason M Berman
(74) *Attorney, Agent, or Firm* — Buchanan Ingersoll & Rooney PC

(57) ABSTRACT

A wafer holder including a wafer stage and a wafer stage outer-ring surrounding the wafer stage wherein the wafer stage has a diameter smaller than the diameter of a wafer loaded on the wafer stage, the wafer stage outer-ring has an inner diameter at the upper side of the outer-ring which is larger than the diameter of the wafer loaded on the wafer stage, and the upper surface of the outer-ring lies above the upper surface of the wafer loaded on the wafer stage.

7 Claims, 9 Drawing Sheets

(56) References Cited

U.S. PATENT DOCUMENTS

| | | | |
|---|---|---|---|
| 5,569,350 A * | 10/1996 | Osada et al. | 156/345.51 |
| 5,903,023 A | 5/1999 | Hoshi | |
| 5,906,684 A | 5/1999 | Tamura et al. | |
| 6,159,299 A | 12/2000 | Koai et al. | |
| 6,610,171 B2 | 8/2003 | Tamura et al. | |
| 2003/0019582 A1 * | 1/2003 | Drewery | 156/345.43 |
| 2004/0261946 A1 | 12/2004 | Endoh et al. | |

OTHER PUBLICATIONS

Official Letter issued Aug. 8, 2008 in corresponding China Application No. 200610051417.6.

Handbook of Physical Vapor Deposition (PVD) Processing by Donald M. Mattox. Copyright 1998.

* cited by examiner

ANGLED SPUTTERING PHYSICAL VAPOR DEPOSITION APPARATUS WITH WAFER HOLDER AND WAFER HOLDER FOR AN ANGLED SPUTTERING PHYSICAL VAPOR DEPOSITION APPARATUS

CROSS-REFERENCE TO RELATED APPLICATIONS

This application is a divisional of application Ser. No. 11/307,284, filed on Jan. 30, 2006, which claims priority to Japanese Application No. 2005-050064, filed on Feb. 25, 2005, the specifications of which are incorporated herein by reference in their entireties for all purposes.

FIELD OF THE INVENTION

The present invention relates generally to a wafer holder and a method of holding a wafer, and in one aspect, the present invention relates to a wafer holder including wafer stage and a wafer stage outer-ring surrounding the wafer stage and provided in a plasma processing chamber such as a plasma processing chamber of an angled sputtering system.

BACKGROUND OF THE INVENTION

In fabricating integrated circuits, forming many different films on Si wafers by physical vapor deposition (PVD) is one of the common steps. Currently there are many different configurations and methods in performing PVD process, for example ionized PVD and long-through-sputtering.

An angled sputtering is one of the PVD techniques where the target and wafer are placed not in parallel but with an angle. See JP 2002-194540. The advantage of this sputtering technique is it yields extremely uniform film. The disadvantage of this technique is that edge exclusion (hereinafter referred to "EE") for a film deposited on a wafer surface trades-off with film wrapping around the wafer edge. This is explained in details with reference to FIGS. 5 to 9 of the present application.

A cross sectional diagram of an example of an angled sputtering system and a conventional wafer holder 50 adopted in the angled sputtering system are shown in FIGS. 5 to 8, respectively. The process chamber of this angled sputtering system has a vacuum port 66 and a wafer in/out port 67. The wafer holder 50 is comprised of wafer stage 51, insulating shield 52 surrounding wafer stage 51, metallic outer-shield 53, shaft 54 supporting the metallic outer-shield 53 and a masking outer-ring 55. The masking outer-ring 55 is attached to several metallic or insulating pins 56, usually 3 (three) metallic or insulating pins, in order to move the masking outer-ring 55 up and down. In FIG. 5, the insulating pins 56, 56 are moved up and down by lift-up pin controller 65.

While the wafer 57 is loaded on to the wafer stage 51, the masking outer-ring 55 is raised up. After the wafer 57 is placed on the wafer stage 51, the masking outer-ring 55 is lowered until the separation between the upper surface of wafer 57 and the backside surface of the masking outer-ring 55 is less than 1 mm. Usually, the masking outer-ring 55 is not lowered until the backside surface of it touches the wafer 57, since it causes a generation of particles on the surface of wafer 57 by the fraction. The masking outer-ring 55 covers a few millimeters, usually less than 5 mm, on the wafer edge 62 (FIG. 7). This covered region is denoted by X (denoted by numeral 63) in FIGS. 7 and 8.

The configuration of other conventional and commonly used wafer holder is given in FIG. 9 wherein there is no masking outer-ring.

Problems to be Solved

FIGS. 7 and 8 show the film deposition characteristics at the most close and most far positions on wafer 57 with respect to the target 58 when the film is deposited by the angled sputtering system shown in FIG. 5. These positions are labeled as A (denoted by numeral 59) and B (denoted by numeral 60) in FIG. 6. At position A (59), some atoms 61 from the sputtering target 58 go through the space between the wafer 57 and the masking outer-ring 55, as shown in FIG. 7, and deposit at the wafer edge 62. At position B (60), the shadow due to the existence of masking outer-ring 55 is larger than X (63), as shown in FIG. 8, since atoms 61 are coming in at an angle. This shadowed region is defined as Y (denoted by numeral 64) in FIG. 8. Films are not deposited in this shadowed region Y (64) at position B (60). Because of these different deposition characteristics at positions A (59) and B (60), the film is non-uniform at the wafer edge 62. Further this non-uniform region is larger than X (63), which is the region that is physically covered by the masking outer-ring 55.

This non-uniform region may be extended up to y (64). For example, when X (63) becomes 2 mm, Y (64) may be as large as 10 mm resulting in a 10 mm edge exclusion (EE). Although it is possible to reduce the EE by shortening X (63), it is difficult to get at least 5 mm EE as far as masking outer-ring 55 is used. This is a considerably larger value compared to the semiconductor industry's requirement of small edge exclusion (EE), such as less than 2 mm edge exclusion (EE).

If a masking outer-ring 55 is not adopted in the wafer holder as shown in FIG. 9, films deposit all over the wafer resulting in almost 0 EE. However, in this condition films wrap around the wafer edge and deposit on wafer stage 51. This contaminates the backside of the wafer 57. Film deposition on the wafer stage 51 is an undesirable feature since that film gets thicker and thicker with time. This accelerates and increases the wafer backside contamination with the increase of process time.

Means for Solving the Problem

In order to solve the above-described problems, one aspect of the present invention provides a wafer holder including a wafer stage and a wafer stage outer-ring surrounding the wafer stage wherein the wafer stage has a diameter smaller than the diameter loaded on the wafer stage, the inner diameter at the upper side of the outer-ring is larger than the diameter of wafer loaded on the wafer stage, and the upper surface of the wafer stage outer-ring lies above the upper surface of wafer loaded on the wafer stage.

According to such a wafer holder, since the inner diameter at the upper side of the wafer stage outer-ring is slightly larger than the diameter of wafer loaded on the wafer stage and the wafer stage has a diameter smaller than the diameter of the wafer loaded on the wafer stage so that a narrow space is formed between the outer peripheral of the wafer and the inner peripheral wall of the wafer stage outer-ring. Thereby, it is possible to reduce edge exclusion (EE), for example it is possible to reduce edge exclusion (EE) to less than 2 mm by the before described slightly larger inner diameter at the upper side of the wafer stage outer-ring. And it is possible to reduce the probability in contaminating the backside of wafer with depositing material by the existence of the narrow space between the outer peripheral of wafer and the inner peripheral wall of the wafer stage outer-ring.

Also, since the upper surface of wafer stage outer-ring lies slightly above the upper surface of wafer loaded on the wafer stage, the wafer backside contamination, which is caused when the wafer holder as shown in FIG. 9 is used, can be minimized.

In the before described wafer holder, the wafer holder outer-ring may further have a different inner diameter at the lower side. That is to say, in the above-described wafer holder, the wafer stage outer-ring may be modified to have two different inner diameters, the one is the inner diameter at the upper side of the outer-ring and the other is the inner diameter at the lower side of the outer-ring. The above-described inner diameter at the upper side of the wafer stage outer-ring is slightly larger than the diameter of wafer loaded on the wafer stage as described above, while the inner diameter at the lower side of the wafer stage outer-ring is slightly smaller than the diameter of wafer but slightly larger than the diameter of the wafer stage.

According to this configuration, the above-described narrow space between the outer peripheral wall of the wafer and the inner peripheral wall of the wafer stage outer-ring continues and extends to the narrow space between the outer peripheral wall of the wafer stage and the inner peripheral wall of the wafer stage outer-ring.

Therefore, it is possible to effectively reduce the probability in contaminating the backside surface of wafer with depositing material by the existence of the narrow space between the outer peripheral of wafer and the inner peripheral wall of the wafer stage outer-ring and between the outer peripheral wall of the wafer stage and the inner peripheral wall of the wafer stage outer-ring.

In the above-described wafer holder wherein the wafer stage outer-ring has two different inner diameters, the one is the inner diameter at the upper side of the outer-ring and the other is the inner diameter at the lower side of the outer-ring, the wafer stage outer-ring may be modified to have a horizontal plane formed between one inner peripheral wall defining the inner diameter at the upper side of outer-ring and the other inner peripheral wall defining the inner diameter at lower side of outer-ring, and the horizontal plane lies below the backside surface of the wafer loaded on the wafer stage without contacting the backside surface of wafer.

According to this configuration, it is possible to reduce the probability of contaminating the backside of wafer with depositing material by the existence of the narrow gap between the backside surface of a wafer loaded on the wafer stage and the upper surface of the above-described horizontal plane.

In any of the above-described wafer holders, the wafer stage may be modified to be made of two or more separate pieces for adjusting the height of the wafer stage thereby adjusting the space between the upper surface of the wafer stage and the upper surface of the wafer stage outer-ring.

According to this configuration, it is easy to adjust the shadowed area which is formed at the wafer edge owing to the existence of wafer stage outer-ring for reducing edge exclusion (EE) by adjusting the space between the upper surface of the wafer stage and the upper surface of the wafer stage outer-ring.

This configuration may be modified in that the wafer stage outer-ring can be moved up and down, thereby the shadowed area which is formed at the wafer edge owing to the existence of wafer stage outer-ring may be reduced for reducing edge exclusion (EE) by adjusting the space between the upper surface of wafer stage and the upper surface of wafer stage outer-ring by moving the wafer stage outer-ring up and down.

Also, it is possible to make the wafer stage of two or more separate pieces for adjusting the height of the wafer stage, and make the wafer stage outer-ring which can be moved up and down.

According to one embodiment of the present invention, a wafer holder is provided in which the edge exclusion (EE) can be reduced to less than a 2 mm edge exclusion (EE). It is also possible to reduce the probability of contaminating the backside of wafer, which is loaded on the wafer holder, with depositing material.

In case the wafer holder is used in angled sputter deposition systems, film wrapping around wafer edge can be minimized and also film deposition on wafer backside can be minimized, while yielding very small or zero edge exclusion (EE).

BRIEF DESCRIPTIONS OF THE DRAWINGS

DETAILED DESCRIPTION OF THE PREFERRED EMBODIMENTS

Preferred embodiments of the present invention are described in detail using the attached drawings in the below described examples.

Example 1

Figure 1:
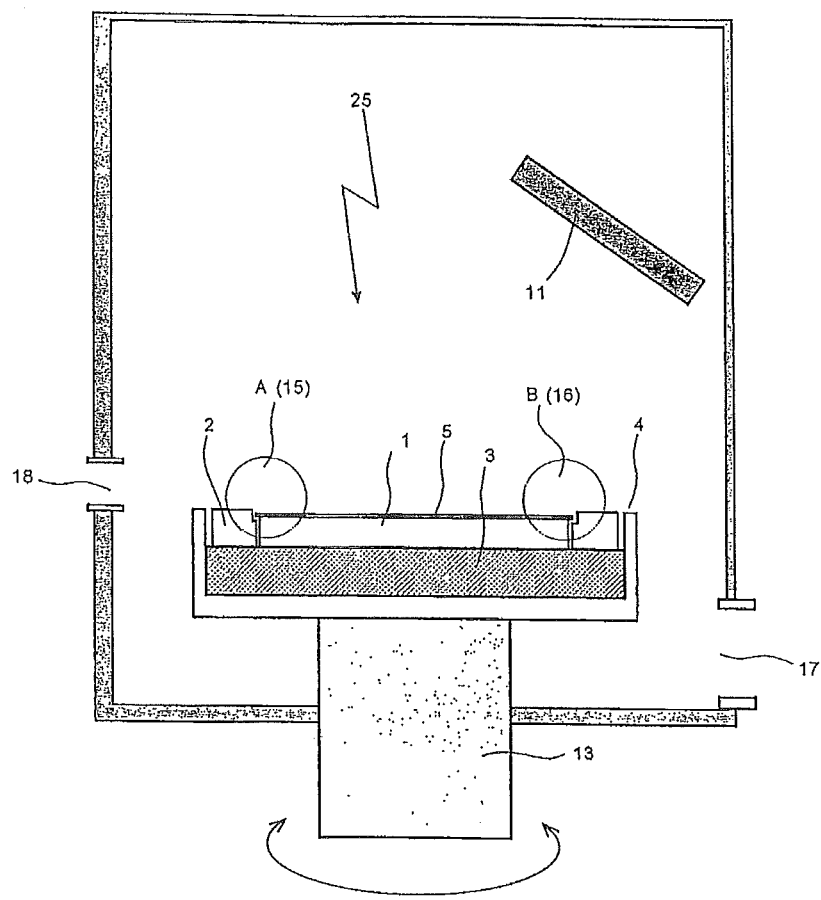
FIG. 1 shows a cross sectional diagram of an angled sputtering system in which a wafer holder according to an embodiment of the present invention is adopted and provided in the angled sputtering system.

Working example 1 of the present invention is explained with reference to FIGS. 1, 2 and 3. FIG. 1 shows a cross sectional diagram of an angled sputtering system in which the wafer holder 25 is one embodiment of the present invention.

The wafer holder 25 is placed in a plasma processing chamber where the target 11 and wafer holder 25 are off axis, and a target 11 is placed in the ceiling of the process chamber with an angle with respect to the surface of the wafer 5 which is loaded on the wafer holder 25 as shown in FIG. 1. The target 11 can be fixed to the ceiling of the process chamber. Although it is not shown, the target 11 may be placed parallel to the surface of wafer 5 which is located on the wafer holder 25.

The process chamber has a vacuum port 17 and wafer in/out port 18.

The wafer holder 25 is comprised of a wafer stage 1, a wafer stage outer-ring 2 surrounding wafer stage 1, an insulating block 3, and an outer shield 4. In this example, the insulating block 3 is placed below the wafer stage 1 and the outer-ring 2, and supports them. Also, the insulating block 3 supporting the wafer stage 1 and the outer-ring 2 is inserted in the cylindrical outer shield 4. The outer-ring 2 is an o-ring shaped wafer-stage outer-ring.

In this embodiment, the wafer stage 1 and the wafer stage outer-ring 2 are an integrated part of the wafer holder 25 placed in a plasma processing chamber, and the wafer holder 25 can rotate around its central axis.

The wafer stage 1 is usually made of a metal, for example aluminum. The diameter of the wafer stage 1 is a few millimeters, for example 10 mm, smaller than the diameter of the wafer 5 which is loaded onto the wafer stage 1. Therefore, when a wafer 5 is placed on the wafer stage 1, the outer area of the wafer 5 extends outside of the wafer stage 1 as shown in FIGS. 1, 2 and 3.

Inner Diameters of the Outer-Ring:

The wafer stage outer-ring 2 has two different inner diameters. One is the inner diameter at the upper side of the outer-ring 2, and the other is the inner diameter at the lower side of the outer-ring 2. The inner diameter at the upper side of the outer-ring 2 is a few millimeters, for example 4 mm, larger than the diameter of the wafer 5. While the inner diameter at the lower side of the outer-ring 2 is few millimeters, for example 3 mm, smaller than the diameter of the wafer 5, but a few millimeters, for example 3 mm, larger than the diameter of wafer stage 1. That is to say, the inner diameter at the upper side of the outer-ring 2 is larger than the diameter of the wafer 5 while the inner diameter at the lower side of the outer-ring 2 is smaller than the diameter of wafer 5, but larger than the diameter of wafer stage 1.

Outer Diameter of Outer-Ring:

The outer diameter of wafer stage outer-ring 2 is not critical and is usually 10-30 mm larger than the diameter of the wafer 5.

As described above, since the outer-ring 2 has two different inner diameters, there is a horizontal plane between one inner peripheral wall defining the inner diameter at the upper side of outer-ring 2 and the other inner peripheral wall defining the inner diameter at lower side of outer-ring 2. It is preferable that the position of this horizontal plane is adjusted to lie just below the backside of the wafer 5 with a small separation, so that this horizontal plane is not in physical contact with the backside of wafer 5. The separation between the horizontal plane and the backside of the wafer 5 is not critical and can be in the region of 0.2 mm to 10 mm, usually larger than 0.5 mm.

Height of the Upper Surface of Outer-Ring:

The height of the upper surface of the outer-ring 2 is important to get the best results. The upper surface of the outer-ring 2 should be slightly above the upper surface of the wafer 5 as shown in FIGS. 1 to 3. The edge exclusion (EE) and wrapping film around the wafer edge are affected by the distance between upper surface of outer-ring 2 and the upper surface of the wafer 5, denoted by letter H (denoted by numeral 14) in FIGS. 2 and 3. It is preferable to maintain the distance H within the range of 1 mm to 10 mm.

The outer-ring 2 is made of a metal, typically aluminum. The surface of outer-ring 2 may be coated with a dielectric material, for example Al2O3. Usually, the outer-ring 2 is configured to be in an electrically floating state. However, it should be noted that the electrical status of the outer-ring 2 does not affect its intended properties with this invention.

The wafer stage 1 is placed on the insulating block 3, preferably a dielectric block. However, this is not an essential requirement in obtaining intended properties with this invention. The only reason to place the wafer stage 1 on an insulating block 3 is to control the deposition properties by applying electrical power to wafer stage 1, when it is necessary.

Figure 2:
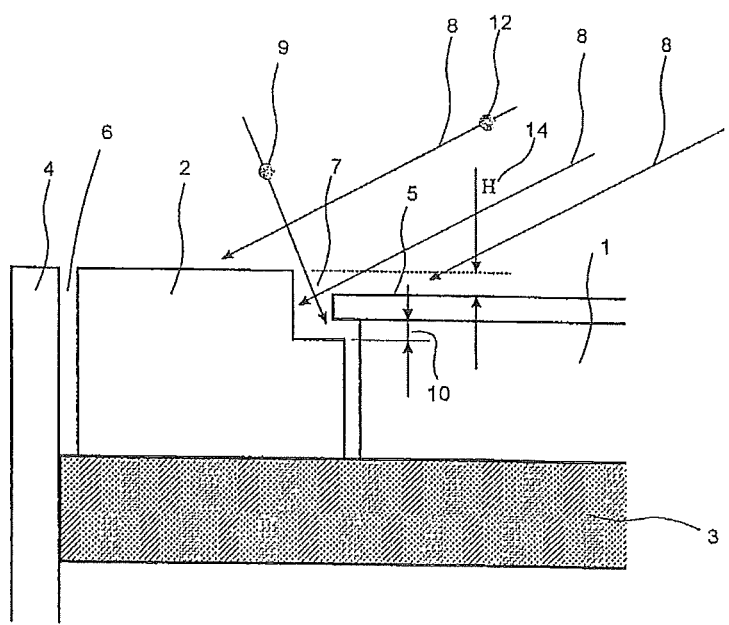
FIG. 2 shows an enlarged cross sectional diagram showing the position A (15) labeled in FIG. 1.
Figure 3:
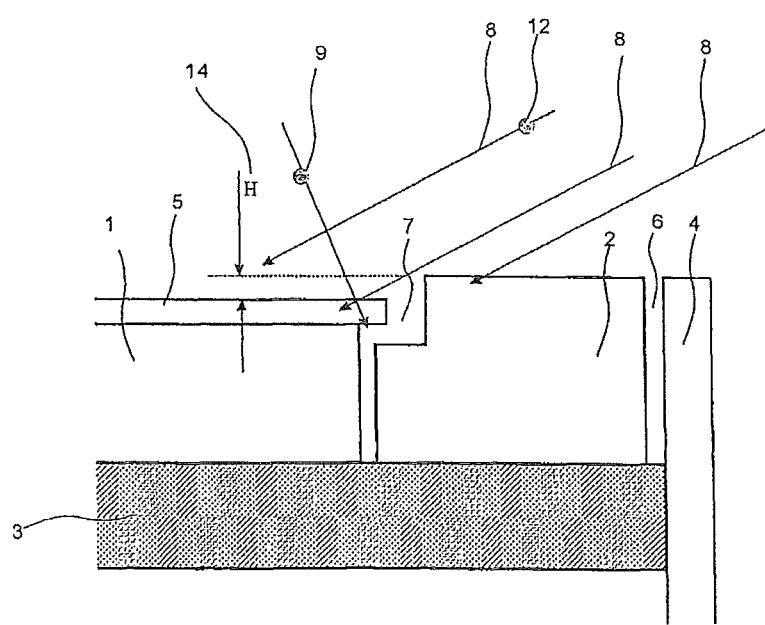
FIG. 3 shows an enlarged cross sectional diagram showing the position B (16) labeled in FIG. 1.

FIGS. 1, 2 and 3 show that the wafer stage 1 is in an electrically floating state. However, it should be noted that the electrically floating state of the wafer stage 1 does not affect its intended properties with this invention.

Instead, one can apply a DC or RF electric power to the wafer stage 1 to control the deposition process.

Moreover, one can fabricate an electrostatic chuck (ESC) on the surface of the wafer stage 1 in order to fix the wafer 5 on the wafer stage 1 during film deposition. These power sources, ESC or any related electrical circuits are not shown in diagrams.

The height of the wafer stage 1 is not critical, but can be varied in the range of 1 mm to 50 mm.

Figure 4:
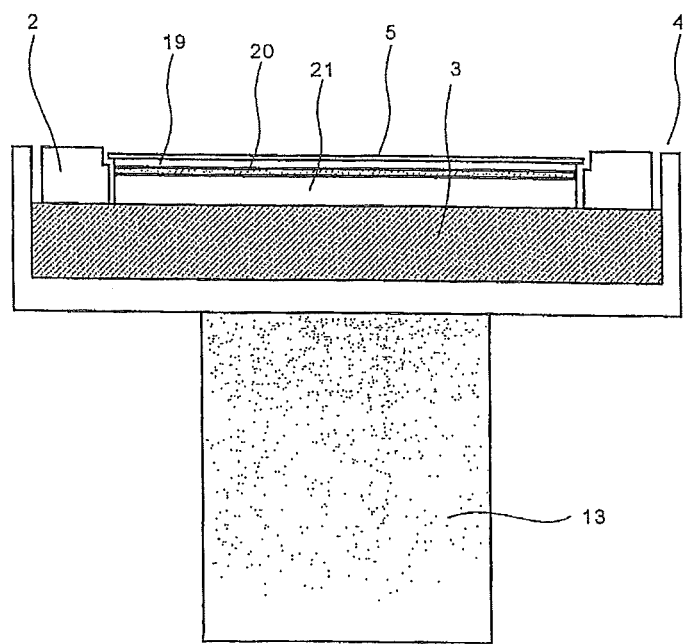
FIG. 4 shows a cross sectional diagram of another embodiment of a wafer holder of the present invention.
Figure 5:
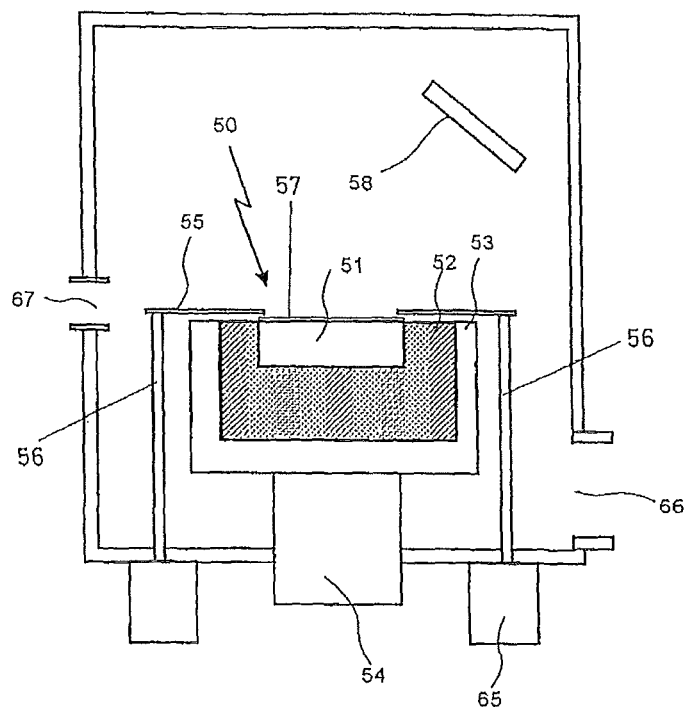
FIG. 5 shows a cross sectional diagram of an angled sputtering system in which a conventional wafer holder is adopted and provided in the angled sputtering system.
Figure 6:
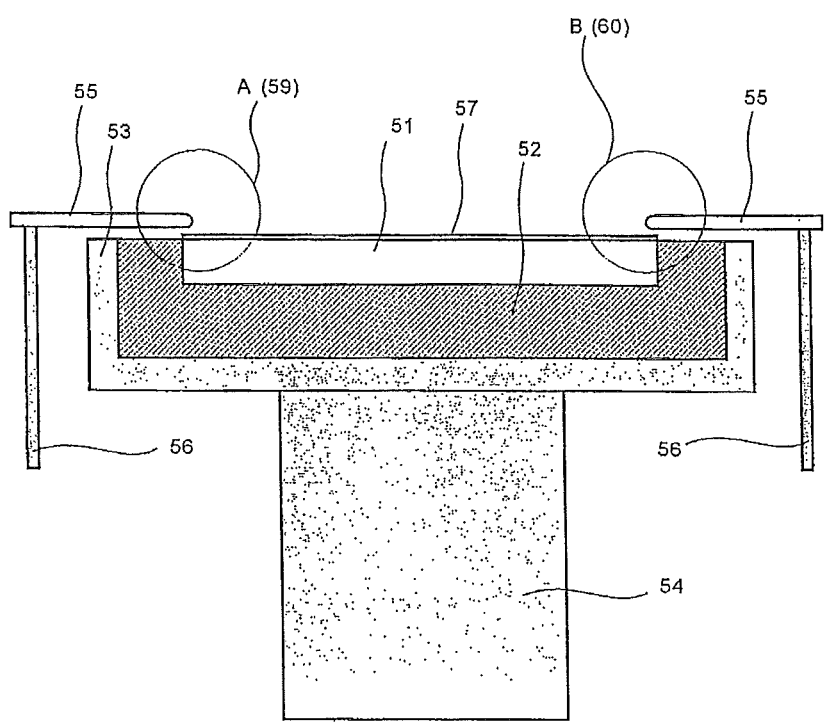
FIG. 6 shows an enlarged cross sectional diagram of the conventional wafer holder shown in FIG. 5.
Figure 7:
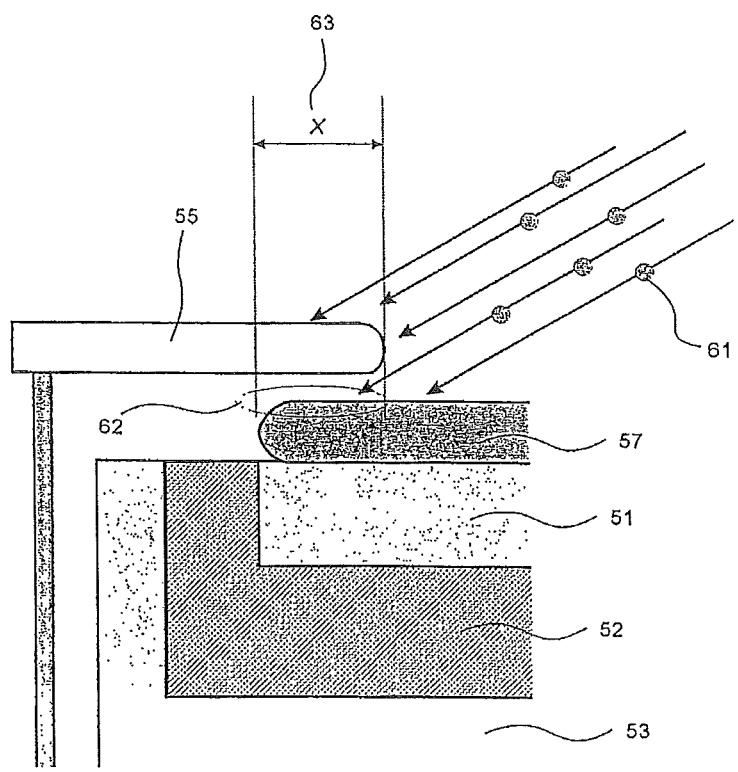
FIG. 7 shows an enlarged cross sectional diagram showing the position A (59) labeled in FIG. 6.
Figure 8:
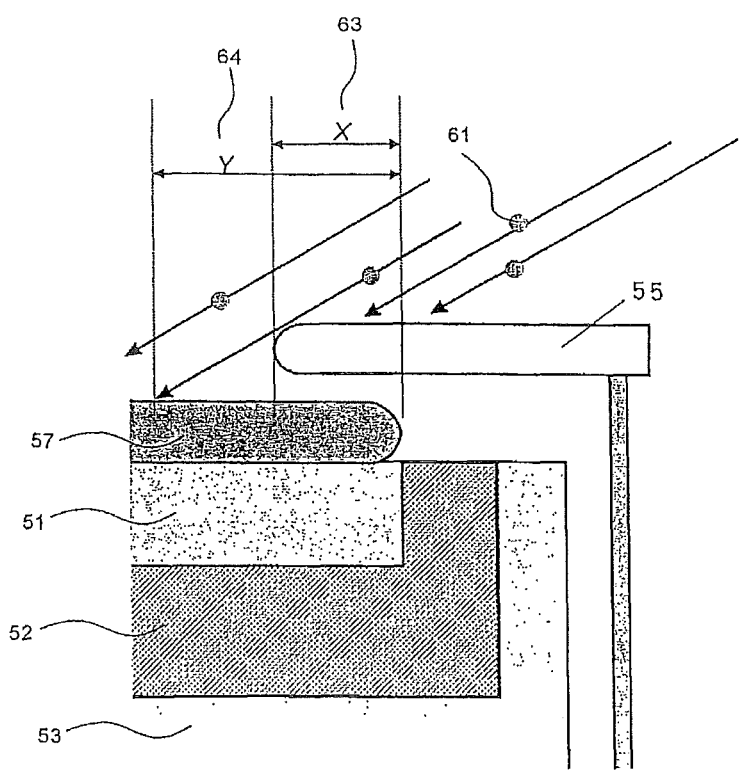
FIG. 8 shows an enlarged cross sectional diagram showing the position B (60) labeled in FIG. 6.
Figure 9:
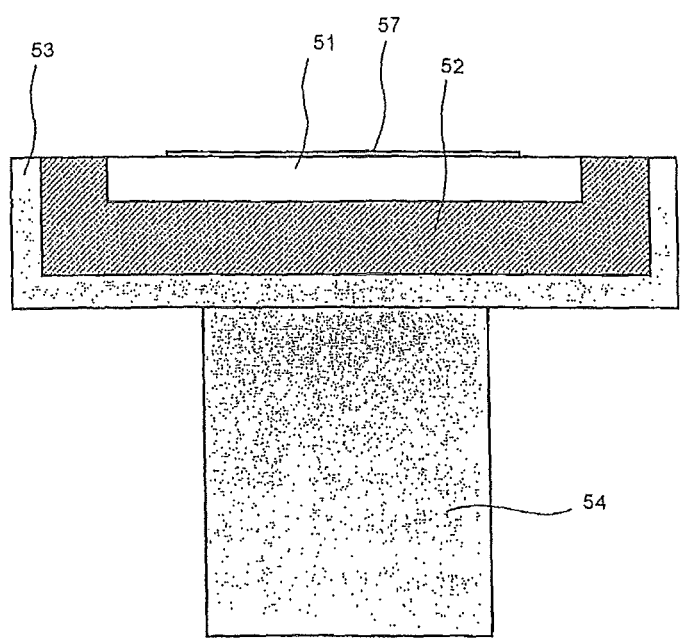
FIG. 9 shows a cross sectional diagram of another conventional wafer holder.

Again, the wafer stage 1 does not have to be made of a single material, instead one can use a composite configuration made of different materials, for example a combination of metal and dielectrics as shown in FIG. 4. In FIG. 4, the wafer stage 1 is comprised of a metal disk 21, insulating disk 20 and metal disk 19. That is to say, in FIG. 4, the wafer stage 1 is made of three separate pieces, so that the height of wafer stage 1 can be adjusted by removing the insulating disk 20, for example. Also, the height of the wafer stage 1 can be adjusted by inserting a further insulating disk, for example, so that the space between the upper surface of wafer stage 1 and the upper surface of wafer stage outer-ring 2 can be adjusted easily.

The wafer stage 1 may or may not be heated or cooled during film deposition. The heating or cooling mechanism of the wafer stage 1 is not shown in diagrams for simplicity.

The outer shield 4 is made of a metal. The inner diameter of the outer shield 4 is slightly larger than the outer diameter of the outer ring 2, so that there is a few millimeter separation between the inner peripheral wall of outer shield 4 and the outer peripheral wall outer ring 2. Alternatively, the insulating block 3 may extend up to the inside wall of the outer shield 4, although it is not shown. The narrow space 6 between the outer shield 4 and the outer-ring 2 is important in order to maintain the electrical status of the outer-ring 2 when it is in an electrically floating state.

In addition to the above-mentioned hardware, the wafer holder may include three or four wafer lift-up pins. These wafer lift-up pins are not shown in diagrams for simplicity.

According to the angled sputtering system in which a wafer holder 25 of an embodiment of the present invention is adopted and provided in the angled sputtering system, as shown in FIGS. 1 to 3 and as described above, the wafer fabricating process is carried out as follows, for example.

The process in obtaining desired properties with this invention is explained with reference to FIGS. 2 and 3, which represent positions A (15) and B (16) labeled in FIG. 1, respectively.

Usually, this PVD process is carried out at very low pressures, lower than 0.1 Pa. At these pressures the mean free path of gaseous species including sputtered atoms 12 becomes very short compared with the distance between the target 11 and the wafer 5. Therefore, almost all depositing atoms can be considered as coming with the angle as shown in FIGS. 2 and 3, which the target 11 is placed with respect to the wafer 5 as shown in FIG. 1.

Deposition at Position A (15):

A film deposits up to the wafer edge at position A (15) as shown in FIG. 2.

The atoms' path at position A (15), where the farthest from the target 11, is shown by arrows 8. The atoms 12 are coming in at an angle, which the target 11 is placed with respect to the wafer 5, as shown in FIG. 1.

Since the inner diameter at the upper side of the outer-ring 2 is larger than the diameter of wafer 5, any shadowed region is not generated as shown in FIG. 2. So that films can be deposited at the wafer edge, and a very small edge exclusion (EE) such as less than 2 mm EE can be obtained at position A (15).

As the pressure is low, gas phase collisions are very few, so that atoms coming in at an opposite angle, as shown by numeral 9, due to gas phase collisions are insignificant. However, this cannot be completely excluded. Even if some of these scattered atoms 9 reach the narrow space 7 between the outer-ring 2 and the wafer 5, these atoms deposit on the inside peripheral walls of the outer-ring 2.

There is a separation 10 between the backside surface of the wafer 5 and the upper surface of the horizontal plane between one inner peripheral wall defining the inner diameter at the upper side of outer-ring 2 and the other inner peripheral wall defining the inner diameter at lower side of outer-ring 2. In this example, the height of the separation 10 is 0.5 mm.

Because of the existence of this separation 10, the backside of the wafer 5 does not get contaminated with depositing material.

Further, since the inner diameter at the upper side of the outer-ring 2 is larger than the diameter of wafer 5 while the inner diameter at the lower side of the outer-ring 2 is smaller than the diameter of wafer 5 but larger than the diameter of wafer stage 1, the narrow space 7 extends up to the insulating block 3, as shown in FIG. 2. This is in order to assure that no film is deposited on the insulating block 3 supporting the outer-ring 2 and the wafer stage 1. The reason is, if a metal film is deposited so as to connect the outer-ring 2 and the wafer stage 1, the electrical potential of both the wafer stage 1 and the outer-ring 2 becomes the same. This creates problems if the wafer stage 1 is given RF or DC bias as a means to control the deposition.

Moreover, the extension of the narrow space 7 up to the insulating block 3, further reduces the probability in contaminating the backside of the wafer 5 with depositing material.

Deposition at Position B (16):

Film deposition process at position B (16) is shown in FIG. 3.

As shown in FIG. 3, atoms 12 are coming in at an angle, which the target 11 is placed with respect to the wafer 5 as shown in FIG. 1, so that the outer-ring 2 may make a shadow on the wafer edge.

The length of the shadow depends on the height of the upper surface of outer-ring 2 with respect to the upper surface of the wafer 5, the distance of the narrow space 7 between the outer-ring 2 and the wafer 5, and the angle of target 11 with respect to the wafer 5.

In this embodiment, since the inner diameter at the upper side of the outer-ring 2 is larger than the diameter of the wafer 5, it is easy to select the height of the upper surface of outer-ring 2 with respect to the upper surface of the wafer 5, which is denoted as H (denoted by numeral 14) in FIG. 3, in order to reduce the shadowed region, which may be generated by the existence of the outer-ring 2. For example, it is easy to select the height (H) by which any shadowed region is not generated as shown in FIG. 3 thereby depositing the films at the wafer edge with a very small edge exclusion (EE), such as less than 2 mm EE can be obtained at position B (16).

As the pressure is low, gas phase collisions are very few, so that atoms coming in at an opposite angle, as shown by numeral 9, due to gas phase collisions are insignificant.

Even if some of these scattered atoms 9 reach the narrow space 7 between the outer-ring 2 and the wafer 5, as described above about at the position A (15), the backside of the wafer 5 does not get contaminated with depositing material by the existence of the separation 10 as shown in FIG. 2 and the existence of narrow space 7 extending up to the insulating block 3. Also, no film is deposited on insulating block 3 supporting the outer-ring 2 and the wafer stage 1 since the narrow space 7 extends up to the insulating block 3 as shown in FIG. 3.

Although preferable embodiments and example of the present invention are described above using the attached figures, the present invention is not limited to the before described embodiments and examples, and the present invention may be modified to various embodiments and examples within the technological scope defined by the accompanying claims and equivalents thereof.

What is claimed is:

1. An angled sputtering Physical Vapor Deposition (PVD) apparatus comprising:
    a wafer holder for positioning a wafer;
    a target holder arranged to hold a target obliquely with a predetermined angle to a surface of the wafer, and
    the wafer holder comprises a rotatable wafer stage configured for mounting the wafer, the diameter of the wafer being larger than that of the wafer stage, and
    a wafer stage outer ring which surrounds the wafer stage, the wafer stage outer ring comprises an upper portion, the inner diameter of which is larger than the diameter of the wafer stage, and a top surface of the upper portion is higher than a top surface of the wafer stage, and a lower portion of the wafer stage outer ring has an inner diameter which is smaller than the inner diameter of the upper portion and but larger than the diameter of the wafer stage and a top surface of the lower portion is lower than the top surface of the wafer stage so that the top surface of the lower portion is positioned not to contact the rear surface of the wafer mounted on the wafer stage, and
    a height of the top surface of the upper portion and a distance between the inner diameter of the upper portion and the wafer stage are configured so that the upper portion makes a shadow on an edge of the wafer with respect to irradiation from the obliquely held target.

2. The angled sputtering PVD apparatus according to claim 1, wherein a gap is formed between the lower portion of the wafer stage outer ring and the wafer stage.

3. The angled sputtering PVD apparatus according to claim 1, wherein a space between the top surface of the lower portion and the top surface of the wafer stage is in the range of 0.2 mm to 10 mm.

4. The angled sputtering PVD apparatus according to claim 1, wherein the wafer stage comprises at least two units to adjust a space between the top surface of the wafer stage and the top surface of the wafer stage outer ring.

5. A wafer holder used in an angled sputtering Physical Vapor Deposition (PVD) apparatus that includes a target arranged obliquely with a predetermined angle to a surface of a wafer and a sputtering is performed with rotating the wafer, the wafer holder comprising:
    a rotatable wafer stage for mounting the wafer, and
    a wafer stage outer ring surrounding the wafer stage,
    wherein the wafer stage outer ring comprises an upper portion the inner diameter of the upper portion is larger than the diameter of the wafer stage and a top surface of the upper portion of the wafer stage outer ring is higher than a top surface of the wafer stage, and a lower portion of the wafer stage outer ring which has an inner diameter that is larger than the diameter of the wafer stage and a top surface of the lower portion is lower than a top surface of the wafer stage, and a height of the top surface of the upper portion and a distance between the inner diameter of the upper portion and the wafer stage are configured so that the upper portion makes a shadow on an edge of the wafer with respect to irradiation from the obliquely held target.

6. The angled sputtering PVD apparatus according to claim 1, wherein the shadow on the edge of the wafer is less than 2 mm.

7. The wafer holder according to claim 5, wherein the shadow on the edge of the wafer is less than 2 mm.

* * * * *